United States Patent
Yamada (10) Patent No.: US 8,509,456 B2
(45) Date of Patent: Aug. 13, 2013

(54) LEVEL ADJUSTING CIRCUIT

(75) Inventor: Moto Yamada, Kyoto (JP)

(73) Assignee: Rohm Co., Ltd. (JP)

( * ) Notice: Subject to any disclaimer, the term of this patent is extended or adjusted under 35 U.S.C. 154(b) by 330 days.

(21) Appl. No.: 12/878,411

(22) Filed: Sep. 9, 2010

(65) Prior Publication Data

US 2011/0200209 A1 Aug. 18, 2011

(30) Foreign Application Priority Data

Sep. 10, 2009 (JP) ................................ 2009-209481
Aug. 11, 2010 (JP) ................................ 2010-180132

(51) Int. Cl.
*H03G 9/00* (2006.01)
*H03G 3/00* (2006.01)
*H04B 15/00* (2006.01)

(52) U.S. Cl.
USPC ........... 381/102; 381/104; 381/94.3; 381/107

(58) Field of Classification Search
USPC .................... 381/107, 102, 104, 94.3, 55, 56, 381/57, 58, 98, 99
See application file for complete search history.

(56) References Cited

U.S. PATENT DOCUMENTS

| 4,432,097 | A | * | 2/1984 | Okada et al. ..................... 381/98 |
| 4,641,361 | A | * | 2/1987 | Rosback ....................... 381/103 |
| 7,215,202 | B2 | * | 5/2007 | Al-Shyoukh et al. ......... 330/279 |
| 7,583,809 | B2 | * | 9/2009 | Okimoto et al. ............... 381/104 |
| 8,150,067 | B2 | * | 4/2012 | Ohkuri et al. ................... 381/98 |

FOREIGN PATENT DOCUMENTS

| JP | 10-084238 A | 3/1998 |
| JP | 2007-060548 A | 3/2007 |

* cited by examiner

*Primary Examiner* — Vivian Chin
*Assistant Examiner* — Ammar Hamid
(74) *Attorney, Agent, or Firm* — Cantor Colburn LLP (57) ABSTRACT

A circuit configured to adjust the level of an audio signal includes filters each of which is configured to receive an audio signal, and to pass a band set for the filter. Variable gain amplifiers are severally provided to the respective filters, and each variable gain amplifier amplifies the output signal of the corresponding filter. An adder sums the input audio signal and the output signals of the variable gain amplifiers. A control unit controls the level of the output signal of each of the variable gain amplifiers, and controls the gain of each variable gain amplifier according to the level thus monitored.

16 Claims, 4 Drawing Sheets

LEVEL ADJUSTING CIRCUIT

BACKGROUND OF THE INVENTION

1. Field of the Invention

The present invention relates to a technique for preventing clipping of an audio signal.

2. Description of the Related Art

In order to output an audio signal via a speaker or headphones (which will collectively be referred to as a "speaker" hereafter), an amplifier circuit configured to amplify an infinitesimal electrical signal is employed. The level of the audio signal to be input to the amplifier circuit, i.e., the volume, changes over time in increments of input sources according to the audio content to be reproduced, or according to the state of an upstream circuit. For example, while viewing television, it is well known that there is a significant difference in volume between television programs and commercials. With an arrangement employing an amplifier circuit having a constant gain, in a case in which the audio signal is overly loud, it exceeds the possible range of amplification in a downstream stage, which results in the signal being clipped (clamped), and distortion occurs.

In order to solve such a problem, a method is employed in which the audio signal level is monitored, and the gain of a variable gain amplifier circuit is controlled. In general, such a method is also referred to as AGC (Automatic Gain Control).

RELATED ART DOCUMENTS

Patent Documents

[Patent document 1]
Japanese Patent Application Laid Open No. H10-84238
[Patent document 2]
Japanese Patent Application Laid Open No. 2007-60548

With AGC, when the level of the audio signal reaches a given upper limit threshold, the gain is reduced (attack operation) by a predetermined amount (e.g., 1 dB), and when the level of the audio signal reaches a given lower limit threshold, the gain is raised (recovery operation) by a predetermined amount. Because the AGC operation changes the volume of the signal output via the speaker, in some cases, such an arrangement produces an unnatural change in volume, causing discomfort to the listener.

SUMMARY OF THE INVENTION

The present invention has been made in order to solve such a problem. Accordingly, it is an exemplary purpose of an embodiment of the present invention to provide a circuit which is capable of performing a gain control operation while minimizing the listener's discomfort.

An embodiment of the present invention relates to a level adjustment circuit configured to adjust the level of an audio signal. The level adjustment circuit comprises at least one or more filters, at least one or more variable gain amplifiers, an adder, and a control unit. The aforementioned at least one or more filters are each configured to receive an input audio signal, and to pass a band set for the respective filter. Each of the aforementioned at least one or more variable gain amplifiers is provided to the corresponding filter. Furthermore, each variable gain amplifier is configured to amplify the output signal of the corresponding filter. The adder is configured to sum the input audio signal and the output signals of the aforementioned at least one or more variable gain amplifiers. The control unit is configured to monitor the level of the output signal of each of the aforementioned at least one or more variable gain amplifiers, and to control the gain of each of the aforementioned at least one or more variable gain amplifiers according to the level thus monitored.

With such an embodiment, the volume is adjusted in increments of bands of the audio signal. Thus, such an arrangement reduces the discomfort caused to the listener as compared with an arrangement configured to adjust the volume of a full band audio signal.

Also, the control unit may comprise: a selector configured to receive the output signals of the aforementioned at least one or more variable gain amplifiers, and to select one from among the output signals thus received; a peak hold circuit configured to receive the signal thus selected by the selector, and to hold the peak level of the signal thus received; a comparator configured to compare the output signal of the peak hold circuit with a predetermined threshold value, and to generate level data which represents the comparison result; and at least one or more gain setting units, each of which is provided to a corresponding one of the aforementioned at least one or more variable gain amplifiers, and each of which is configured to set the gain of the corresponding variable gain amplifier according to the level data generated for the corresponding variable gain amplifier.

With such an arrangement, multiple bands can share the level detection unit. Thus, such an arrangement provides a reduced circuit area.

Also, the selector may be configured to select, in sequence and in a time sharing manner, at least one or more output signals set beforehand from among the signals output from the aforementioned at least one or more variable gain amplifiers. With such an arrangement, the volume adjustment operation is performed in increments of bands in a time sharing manner, i.e., at different timings. Thus, such an arrangement further reduces the discomfort caused to the user.

Also, the periods for which the selector selects the output signals of given variable gain amplifiers may differ in increments of the pass bands of the filters that correspond to the variable gain amplifiers.

The selection period is preferably set to be longer for the lower pass bands.

Also, the comparator may generate level data which represents at least three states, comprising a state in which the output signal of the peak hold circuit is higher than a predetermined upper limit level, a state in which the output signal of the peak hold circuit is lower than a predetermined lower limit level, and a state in which the output signal of the peak hold circuit is in a range between the upper limit level and the lower limit level. Also, each of the aforementioned at least one or more gain control units may comprise a counter configured to count up or otherwise to count down according to the level data, and may be configured to set the gain of the corresponding variable gain amplifiers according to the count value of the counter.

Another embodiment of the present invention relates to an audio system. The audio system comprises: a level adjustment circuit according to any one of the aforementioned embodiments; a main amplifier configured to amplify the output signal of the level adjustment circuit; and an electroacoustic transducer configured to be driven by the main amplifier.

Also, the level adjustment circuit may be monolithically integrated on a single semiconductor substrate. Examples of "arrangements monolithically integrated" include: an arrangement in which all the elements of a circuit are formed on a single semiconductor substrate; and an arrangement in which principal elements of a circuit are monolithically integrated. Also, a part of the resistors, capacitors, and so forth, for adjusting circuit constants, may be provided as elements external of the semiconductor substrate.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

Figure 1:
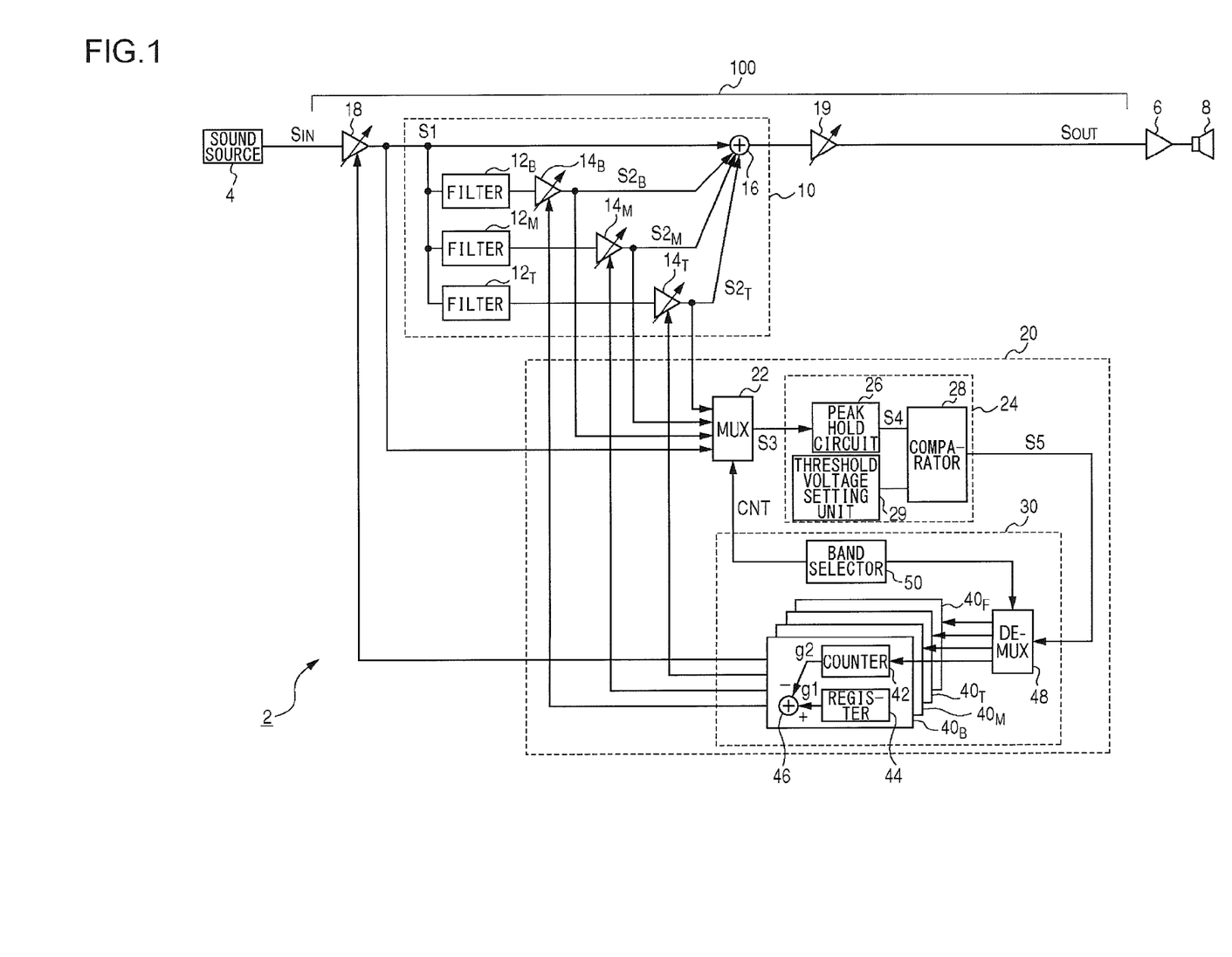
FIG. 1 is a block diagram which shows a configuration of an audio system including a level adjustment circuit according to an embodiment.

FIG. 1 is a block diagram which shows a configuration of an audio system 2 including a level adjustment circuit 100 according to an embodiment. The audio system 2 is mounted on an electronic device having a function of reproducing an audio signal. Examples of such electronic devices include car audio head units, home audio system amplifiers, TVs, cellular phone terminals, etc.

The audio system 2 includes a sound source 4, a main amplifier 6, and an electroacoustic transducer 8, in addition to the level adjustment circuit 100. The sound source 4 may be configured as a CD player, a silicon audio player (digital audio player), a radio tuner, or the like, and generates an analog audio signal $S_{IN}$. The level adjustment circuit 100 receives the audio signal $S_{IN}$, and adjusts the level of the audio signal $S_{IN}$ so as to prevent the occurrence of distortion due to clipping. In brief, the level adjustment circuit 100 has a function as an equalizer (booster circuit), which will be described in detail.

The main amplifier 6 receives an output signal $S_{OUT}$ from the level adjustment circuit 100, amplifies the signal thus received, and outputs the resulting signal to the electroacoustic transducer 8. The electroacoustic transducer 8 is configured as a speaker or headphones.

For example, the level adjustment circuit 100 is mounted on a car audio system head unit together with the sound source 4 and the main amplifier 6. With another arrangement, the level adjustment circuit 100 is mounted on a pre-main amplifier of a home audio system together with the main amplifier 6. With yet another arrangement, the level adjustment circuit 100 is mounted on a TV together with the audio system 2, the sound source 4, the main amplifier 6, and the electroacoustic transducer 8. The above is the overall configuration of the audio system 2. FIG. 1 shows only a single-channel configuration. In practice, the audio system may be a two channel stereo system or a 5.1 channel system.

Next, description will be made regarding the configuration of the level adjustment circuit 100.

The level adjustment circuit 100 includes an input variable gain amplifier 18, a tone control circuit 10, a fader volume amplifier 19, and a control unit 20. The input variable gain amplifier 18 amplifies the input audio signal $S_{IN}$. The signal S1 amplified by the input variable gain amplifier 18 will also be referred to as the "audio signal" hereafter. The level adjustment circuit 100 performs equalizing processing on the output signal of the input variable gain amplifier 18. The signal input to the fader volume amplifier 19 is amplified with a gain that has been set for each channel.

The tone control circuit 10 includes filters $12_B$, $12_M$, and $12_T$, variable gain amplifiers $14_B$, $14_M$, and $14_T$, and an adder 16. "B" represents the bass band (bass), "M" represents the mid-band (middle), and "T" represents the treble band (treble). The subscripts B, M, and T, each of which represents an audio band (band), will be omitted as appropriate. It should be noted that the subscript "F" described later represents the full audio band (full band).

The filters $12_B$, $12_M$, and $12_T$ each receive the audio signal S1, and each pass the respective band set for the filter. The variable gain amplifiers $14_B$, $14_M$ and $14_T$ are provided to the filters $12_B$, $12_M$, and $12_T$, respectively. Each variable gain amplifier 14 amplifies the output signal of the corresponding filter 12. The adder 16 sums the signals $S2_B$, $S2_M$, and $S2_T$ output from the variable gain amplifiers 14 and the original audio signal S1.

The control unit 20 monitors the levels of the output signals $S2_B$, $S2_M$, and $S2_T$ output from the variable gain amplifiers $14_B$, $14_M$, and $14_T$, respectively. Furthermore, the control unit 20 controls the gains of the variable gain amplifiers $14_B$, $14_M$, and $14_T$ according to the levels thus detected so as to prevent clipping of the output signals $S2_B$, $S2_M$, and $S2_T$.

The control unit 20 includes a multiplexer (selector) 22, a level detection unit 24, and a logic unit 30.

The selector 22 receives the output signals S1, $S2_B$, $S2_M$, and $S2_T$ from the input variable gain amplifier 18 and from the respective variable gain amplifiers $14_B$, $14_M$, and $14_T$, and selects the one signal that corresponds to the control signal CNT received from a band selector 50 and outputs the signal thus selected to the level detection unit 24.

The level detection unit 24 includes a peak hold circuit 26, a comparator 28, and a threshold voltage setting unit 29. The peak hold circuit 26 receives a signal S3 selected by the selector 22, and holds the peak level of the signal S3 thus received. The comparator 28 compares an output signal S4 of the peak hold circuit 26 with a predetermined threshold value, and generates level data S5 which represents the comparison result.

The logic unit 30 includes gain setting units $40_B$, $40_M$, $40_T$, and $40_F$, a demultiplexer 48, and a band selector 50.

The gain setting units $40_B$, $40_M$, $40_T$, and $40_F$ are provided to the variable gain amplifiers $14_B$, $14_M$, $14_T$, and 18, respectively.

The demultiplexer 48 receives the level data S5 for the respective bands, and distributes the level data S5 thus received to the gain setting unit 40 that corresponds to the level data S5. That is to say, each gain setting unit 40 receives the level data S5 generated for the corresponding band. With such an arrangement, the gain setting unit 40 sets the gain of the variable gain amplifier 14 assigned to the corresponding band, according to the level data S5 thus received.

The band selector 50 controls the selector 22 and the demultiplexer 48. The selector 22 and the demultiplexer 48 are controlled such that they select a corresponding band. For example, when the selector 22 selects the signal $S2_M$ for the mid-band M, the demultiplexer 48 outputs the level data S5 to the gain setting unit $40_M$ assigned to the mid-band M.

Here, the first mode represents a state in which the selector 22 selects any one of the output signals of the variable gain amplifiers 14 other than the output signal of the input variable gain amplifier 18, and the demultiplexer 48 selects a gain setting unit 40 other than the gain setting unit $40_F$. The second mode represents a state in which the selector 22 selects the output signal of the input variable gain amplifier 18, and the demultiplexer 48 selects the gain setting unit $40_F$.

Such an arrangement is preferably configured such that the selection of the first mode or the second mode, and the selection of which band is to be controlled in the first mode, can be controlled according to data written to a register (not shown) provided to the band selector 50.

The comparator 28 generates the level data S5 which represents at least three states, i.e., the state in which the output signal S4 of the peak hold circuit 26 is higher than a predetermined upper limit level VUL (the attack state), the state in which the output signal S4 is lower than a predetermined lower limit level (the recovery state, which is also referred to as the "release state"), and the state in which the output signal S4 is in a range between the upper limit level and the lower limit level (the first keep state). Also, a state in which the output signal S4 is lower than the lower limit level VLL, specifically a state in which the output signal S4 is lower than a threshold value VIGN that is lower than the lower limit level VLL, may be determined to be a second keep state.

Each gain setting unit 40 includes a counter 42, a register 44, and an adder 46. The register 44 holds an initial gain g1 which is set for the tone control circuit 10 independent of the level adjustment function. The count value of the counter 42 represents the gain correction value. The adder 46 subtracts the correction value g2 from the initial gain g1. The gain of the corresponding variable gain amplifier 14 is set according to the output data of the adder 46.

The count value (correction value) of the counter 42 is incremented or decremented according to the level data S5. Specifically, when the attack state continues for a predetermined first period τ1, the counter counts up, and when the recovery state continues for a predetermined second period τ2, the counter counts down. The first period τ1 is preferably set to be shorter than the second period τ2. For example, an arrangement may be made in which τ1 is set to 1 ms, and τ2 is set to 1 s. If the attack state continues, the count value of the counter 42 becomes larger, resulting in a fall in the gain of the variable gain amplifier 14. Conversely, when the recovery state continues, the count value of the counter 42 becomes smaller, resulting in a rise in the gain of the variable gain amplifier 14.

Description will be made regarding an example configuration of the counter 42. The counter 42 includes a first timer provided for the attack operation and a second timer provided for the recovery operation. The first timer and the second timer measure the first period τ1 and the second period τ2, respectively. The first timer measures the period of the attack state. When the count value of the first timer reaches the first period τ1, the first timer instructs the counter 42 to count up. The second timer measures the period of the recovery state. When the count value of the second timer reaches the second period τ2, the second timer instructs the counter 42 to count up.

The above is the configuration of the level adjustment circuit 100. Next, description will be made regarding the operation thereof in the first mode and the operation thereof in the second mode.

[First Mode]

First, as an example, description will be made regarding the operation when the band selector 50 selects the output signal $S2_B$ of the variable gain amplifier $14_B$, and the demultiplexer 48 selects the gain setting unit $40_B$.

Figure 2:
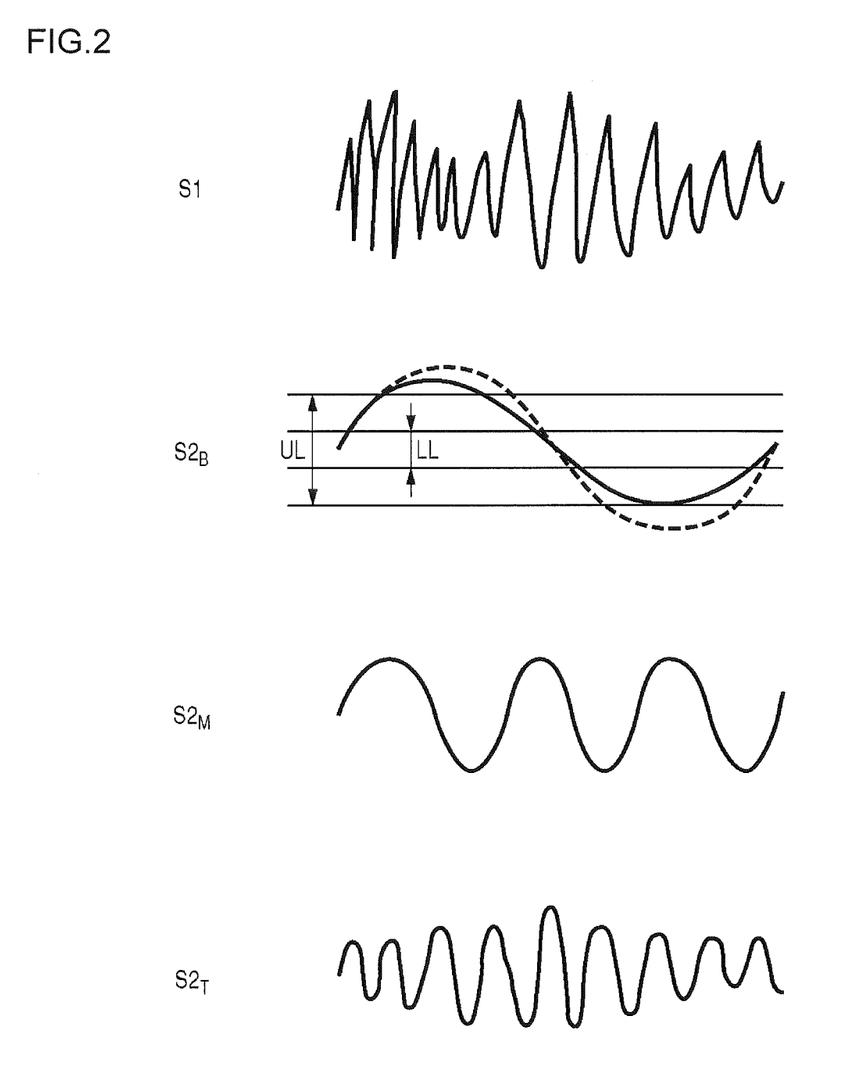
FIG. 2 is a waveform diagram which shows the operation of a level adjustment circuit shown in FIG. 1.

FIG. 2 is a waveform diagram which shows the operation of the level adjustment circuit 100 shown in FIG. 1. The vertical axis and the horizontal axis shown in FIG. 2 are expanded or reduced as appropriate for ease of understanding. Also, each waveform shown in the drawing is simplified for ease of understanding. The waveform of the signal $S2_B$ indicated by the broken line represents the waveform obtained by amplifying the bass component of the audio signal S1, i.e., the output signal of the filter $12_B$, with the initial gain g1 set in the register 44. When the amplitude level of the signal $S2_B$ reaches an upper limit level VUL, the attack operation is executed. This reduces the gain of the variable gain amplifier $14_B$, thereby reducing the amplitude level of the waveform of the bass component $S2_B$ as indicated by the solid line. As a result, the amplitude of the bass component $S2_B$ is held to a level lower than the upper limit level VUL.

Conversely, when the bass component of the audio signal S1 becomes lower than a given lower limit level VLL, the gain of the variable gain amplifier $14_B$ is raised. As a result, in the audio signal output via the electroacoustic transducer 8, only the volume of the bass component is controlled. Thus, as compared with conventional AGC configured such that the volume is changed over the full audio band, such an arrangement significantly reduces the discomfort caused to the listener. For example, in a case in which the gain adjustment is performed in increments of 1 dB, such conventional AGC adjusts the volume of the full audio band in increments of 1 dB. Accordingly, with such conventional AGC, the listener can easily perceive the change in the volume. In contrast, with the level adjustment circuit 100 shown in FIG. 1, only the volume of the bass component is changed in increments of 1 dB, while the volumes of the other bands (treble component and mid-band component) are not changed. Thus, with such an arrangement, the change in the volume is almost imperceptible to the listener, thereby reducing the listener's discomfort.

The same control operation can be performed on the mid-band and the treble band. Thus, such an arrangement provides the same advantages for the mid-band and the treble band.

Also, in the first mode, the selector 22 and the demultiplexer 48 may select, cyclically and in a time sharing manner, several bands set beforehand from among the multiple bands B, M, and T. This mode will be referred to as the "cyclic mode".

For example, all three bands B, M, and T may each be selected for a predetermined third period τ3. The third period τ3 may be set to the same value as that of the first period τ1.

Such an arrangement selects the bass band B for the first period of 1 ms, and the level detection unit 24 judges which of the attack state, the recovery state, or the keep state is to be selected for the bass band. With such an arrangement, the same processing as described above is performed, thereby controlling the gain of the variable gain amplifier $14_B$.

Subsequently, the mid-band M and the treble band T are selected, in this order. With such an arrangement, the same processing is performed on the mid-band M and the treble band T, thereby controlling the gains of the variable gain amplifiers $14_M$ and $14_T$.

In the cyclic mode, the gains set for the respective bands are changed at different timings in a time sharing manner. In other words, the volume of the audio signal output from the electroacoustic transducer 8 does not change for all the bands at the same time. Thus, with such an arrangement, the listener does not readily perceive the change in the volume, and the listener's discomfort can be reduced.

Moreover, with the cyclic mode, the periods for which the selector 22 and the demultiplexer 48 select the respective bands may be independently set to different periods of time. Specifically, the time for which the band is to be selected may be increased for the lower bands, and the time for which the band is to be selected may be reduced for the higher bands. With such an arrangement in which different selection times are set in increments of bands, the level of each band can be detected in a sure manner. More specifically, with the typical frequency of each band as f, the selection time may be set to $1/(2 \times f)$.

[Second Mode]

In the second mode, the gain of the input variable gain amplifier 18 is controlled according to the output signal S1 of the input variable gain amplifier 18. In the second mode, the same processing as that performed in conventional AGC is executed. By configuring the level adjustment circuit 100 such that it is capable of operating not only in the first mode but also in the second mode, such an arrangement provides the designer of the audio system 2 with a high degree of freedom in the design.

Also, such an arrangement may execute the first mode operation and the second mode operation at the same time.

Description has been made regarding the present invention with reference to the embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

Description has been made with reference to FIG. 1 regarding an arrangement which is capable of performing a tone control operation for three bands, i.e., the bass band, the mid-band, and the treble band. However, the present invention is not restricted to such an arrangement. Also, an arrangement may be made which is capable of performing the tone control operation for only one of these bands. For example, in a case in which the tone control circuit 10 is configured as a bass booster circuit, the filters $12_M$ and $12_T$, and the variable gain amplifiers $14_M$ and $14_T$ may be eliminated.

Alternatively, an arrangement may be made in which the filters 12 and the variable gain amplifiers 14 are provided for the three bands, the selector 22 is eliminated, and the gain control operation is performed on a given single band.

For example, humans tend to experience discomfort with distortion in the bass component. Thus, an embodiment can be effectively made in which the gain control operation is performed for only the variable gain amplifier $14_B$ assigned to the bass band.

With the level adjustment circuit 100 shown in FIG. 1 having a configuration employing the selector 22 and the demultiplexer 48, the level detection unit 24 is shared by the multiple bands. Thus, in a case in which the level adjustment circuit 100 is integrated, such an arrangement requires only one level detection unit 24 having a large circuit area, thereby reducing the overall circuit area of the level adjustment circuit 100. However, the present invention is not restricted to such an arrangement. Also, separate level detection units 24 may be provided in increments of bands. With such an arrangement, the gain control operation can be performed on the multiple bands at the same time or at different timings.

Figure 3:
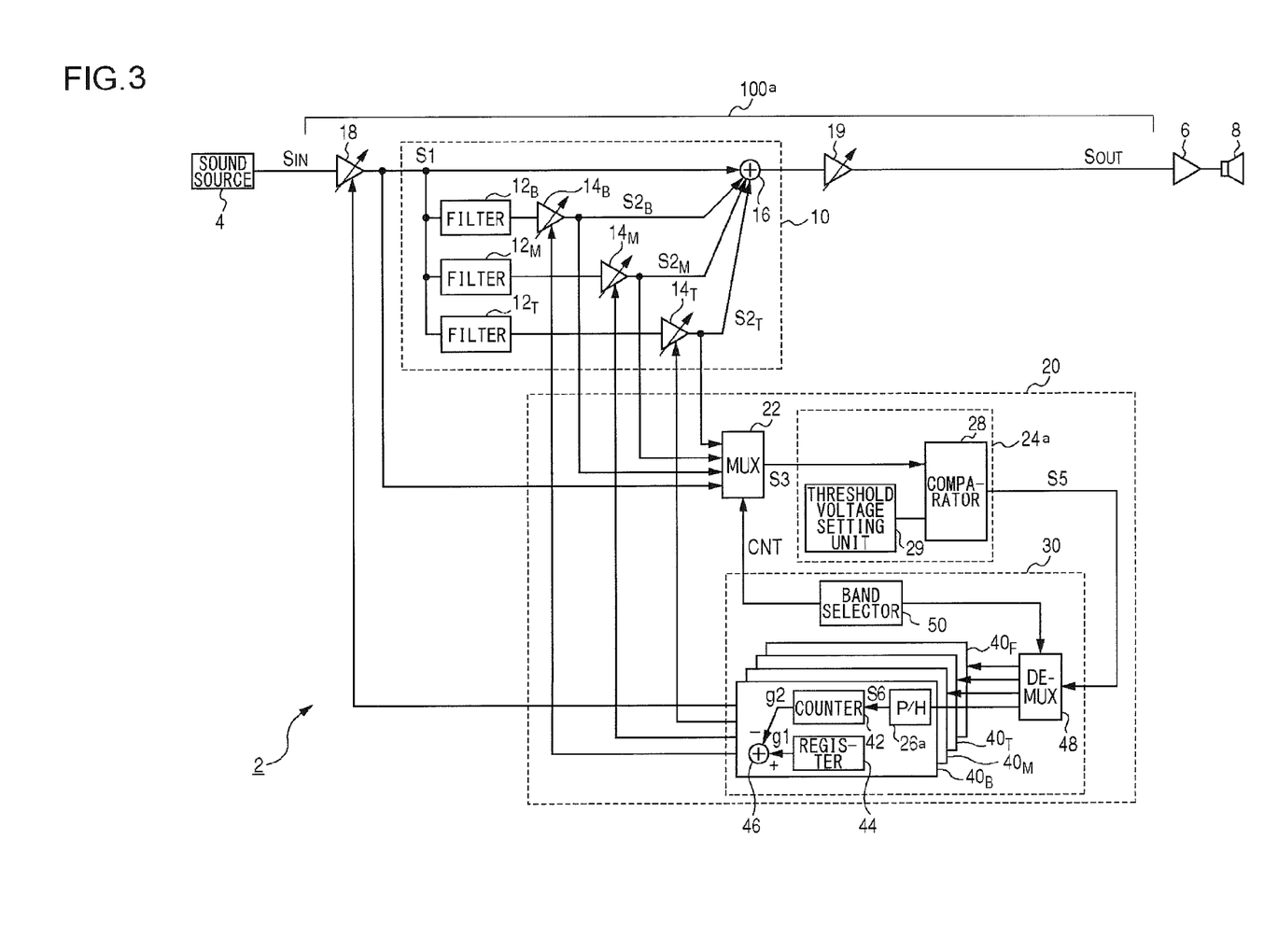
FIG. 3 is a block diagram which shows a configuration of an audio system including a level adjustment circuit according to a modification.

FIG. 3 is a block diagram which shows a configuration of an audio system including a level adjustment circuit 100a according to a modification. Description has been made with reference to FIG. 1 regarding an arrangement in which the peak hold circuit 26 is provided to the level detection unit 24. In contrast, FIG. 3 shows an arrangement in which a peak hold circuit 26a is provided to the gain setting unit 40 rather than to the level detection unit 24a.

The peak hold circuit 26a provided to the gain setting unit 40 is configured as a logic circuit. If a predetermined level signal (specifically, a high level signal) is input at least once in a given period, the peak hold circuit 26a holds the level of the signal, and generates a hold signal S6. Although there is a need to provide such a peak hold circuit 26a to each of the four gain setting units 40, each peak hold circuit 26a can be configured as a small-scale digital circuit. Thus, such an arrangement has an advantage of a smaller overall circuit area than that of the peak hold circuit 26 shown in FIG. 1.

Figure 4:
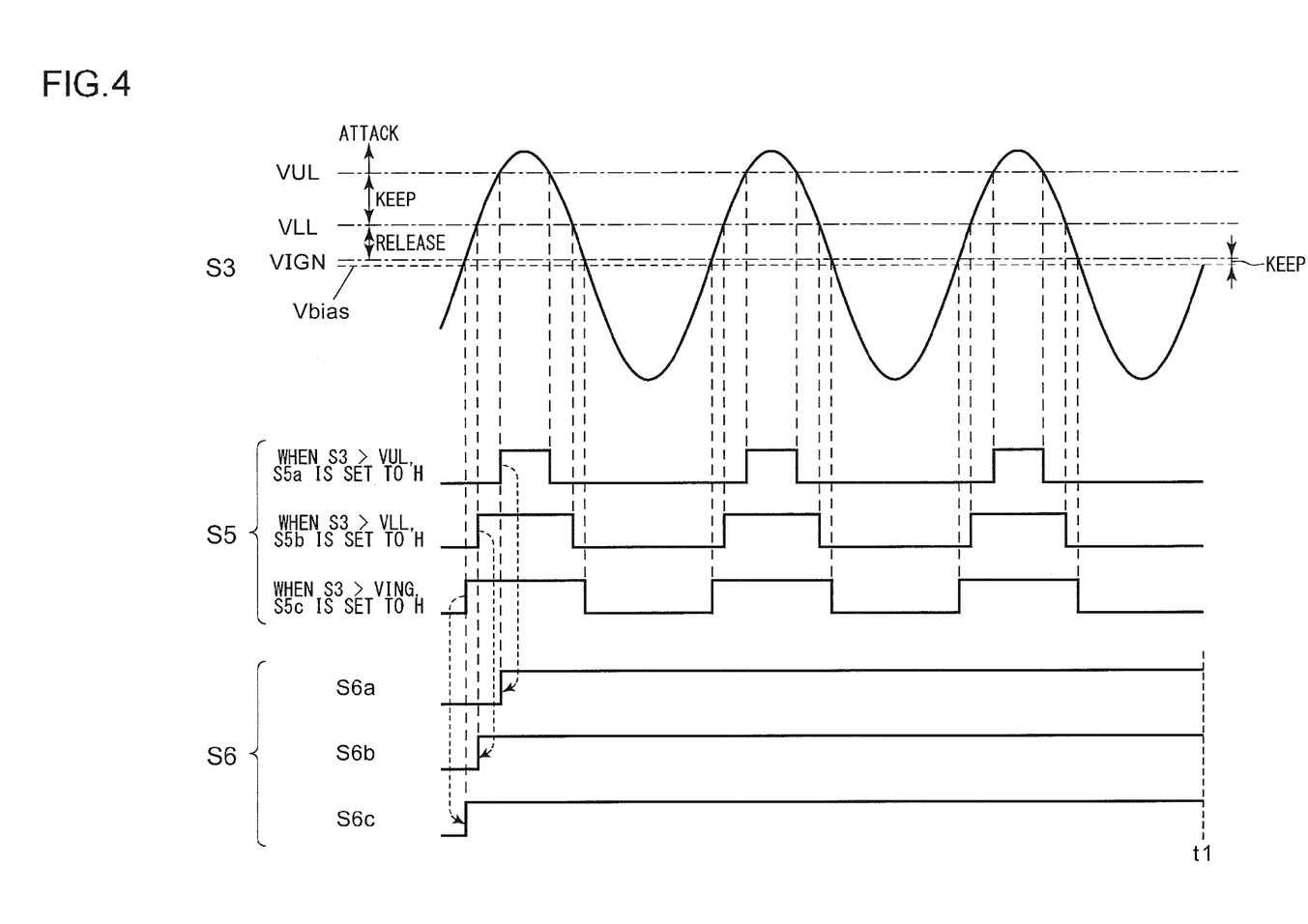
FIG. 4 is a waveform diagram which shows the operation of the level adjustment circuit shown in FIG. 3.

FIG. 4 is a waveform diagram which shows the operation of the level adjustment circuit 100a shown in FIG. 3. The signal S3 selected by the selector 22 swings with a given bias level as the center level. The level data S5 output from the comparator 28 includes the signals S5a through S5c. When S3>VUL, the signal S5a is set to high level. When S3>VLL, the signal S5b is set to high level. When S3>VIGN, the signal S5c is set to high level. The peak hold circuit 26a receives the level data S5 (S5a through S5c). When any one of the signals S5a through S5c becomes high level at least once, the peak hold circuit 26a holds the high level of the signal, and generates a hold signal S6 (S6a through S6c).

At a given judgment timing t0:

1) when all the signals S6a, S6b, and S6c are high level, judgment is made that the state is the attack state;

2) when the signal S6a is low level and the signals S6b and S6c are high level, judgment is made the state is the keep state;

3) when the signals S6a and S6b are low level, and the signal S6c is high level, judgment is made that the state is the release state; and 4) when all the signals S6a, S6b, and S6c are low level, judgment is made that the state is the keep state. Furthermore, the gain control operation is performed based upon the judgment result. After the judgment timing to, the peak hold circuit 26a is reset, and the same operation is repeatedly performed.

While the preferred embodiments of the present invention have been described using specific terms, such description is for illustrative purposes only, and it is to be understood that changes and variations may be made without departing from the spirit or scope of the appended claims.

What is claimed is:

1. A level adjustment circuit configured to adjust the level of an audio signal, comprising:

at least one or more filters, each of which is configured to receive an input audio signal, and to pass a band set for the respective filter;

at least one or more variable gain amplifiers, each of which is provided to a corresponding aforementioned filter, and each of which is configured to amplify an output signal of the corresponding filter;

an adder configured to sum the input audio signal and the output signals of the aforementioned at least one or more variable gain amplifiers; and a control unit configured to monitor the level of the output signal of each of the aforementioned at least one or more variable gain amplifiers, and to control the gain of each of the aforementioned at least one or more variable gain amplifiers according to the level thus monitored, wherein the control unit comprises:

a selector configured to receive signals output from the aforementioned at least one or more variable gain amplifiers, and to select one from among the output signals thus received;

a comparator configured to compare the signal thus selected by the selector with a predetermined threshold value, and to generate level data which represents the comparison result;

at least one or more gain setting units, each of which is provided to a corresponding one of the aforementioned at least one or more variable gain amplifiers, and each of which comprises a peak hold circuit configured to hold the value of the level data when the level data generated for the corresponding variable gain amplifier becomes a predetermined level at least once, and configured to set the gain of the corresponding variable gain amplifier according to an output signal of the peak hold circuit, wherein the selector is configured to select, in sequence and in a time sharing manner, at least one or more output signals set beforehand from among the signals output from the aforementioned at least one or more variable gain amplifiers, and wherein the periods for which the selector selects the output signals of the variable gain amplifiers differ in increments of the pass bands of the filters that correspond to the variable gain amplifiers.

2. The level adjustment circuit according to claim 1, wherein the comparator generates level data which represents at least three states, comprising a state in which the output signal of the selector is higher than a predetermined upper limit level, a state in which the output signal of the selector is lower than a predetermined lower limit level, and a state in which the output signal of the selector is in a range between the upper limit level and the lower limit level, and wherein the aforementioned at least one or more gain control units each comprise a counter configured to count up or otherwise to count down according to the level data, and are each configured to set the gain of the corresponding variable gain amplifiers according to the count value of the counter.

3. The level adjustment circuit according to claim 1, wherein the control unit further comprises a demultiplexer configured to receive the level data output from the comparator, and to output the level data thus received to a gain setting unit, selected from among the aforementioned at least one or more gain setting units.

4. An audio system comprising:

a level adjustment circuit configured to adjust the level of an audio signal;

a main amplifier configured to amplify an output signal of the level adjustment circuit; and an electro acoustic transducer configured to be driven by the main amplifier, wherein the level adjustment circuit comprises:

at least one or more filters, each of which is configured to receive an input audio signal, and to pass a band set for the respective filter;

at least one or more variable gain amplifiers, each of which is provided to a corresponding aforementioned filter, and each of which is configured to amplify an output signal of the corresponding filter;

an adder configured to sum the input audio signal and the output signals of the aforementioned at least one or more variable gain amplifiers; and a control unit configured to monitor the level of the output signal of each of the aforementioned at least one or more variable gain amplifiers, and to control the gain of each of the aforementioned at least one or more variable gain amplifiers according to the level thus monitored, wherein the control unit comprises:

a selector configured to receive signals output from the aforementioned at least one or more variable gain amplifiers, and to select one from among the output signals thus received;

a comparator configured to compare the signal thus selected by the selector with a predetermined threshold value, and to generate level data which represents the comparison result;

at least one or more gain setting units, each of which is provided to a corresponding one of the aforementioned at least one or more variable gain amplifiers, and each of which comprises a peak hold circuit configured to hold the value of the level data when the level data generated for the corresponding variable gain amplifier becomes a predetermined level at least once, and configured to set the gain of the corresponding variable gain amplifier according to an output signal of the peak hold circuit, wherein the selector is configured to select, in sequence and in a time sharing manner, at least one or more output signals set beforehand from among the signals output from the aforementioned at least one or more variable gain amplifiers, and wherein the periods for which the selector selects the output signals of the variable gain amplifiers differ in increments of the pass bands of the filters that correspond to the variable gain amplifiers.

5. A level adjustment circuit configured to adjust the level of an audio signal, comprising:

at least one or more filters, each of which is configured to receive an input audio signal, and to pass a band set for the respective filter;

at least one or more variable gain amplifiers, each of which is provided to a corresponding aforementioned filter, and each of which is configured to amplify an output signal of the corresponding filter;

an adder configured to sum the input audio signal and the output signals of the aforementioned at least one or more variable gain amplifiers; and a control unit configured to monitor the level of the output signal of each of the aforementioned at least one or more variable gain amplifiers, and to control the gain of each of the aforementioned at least one or more variable gain amplifiers according to the level thus monitored, wherein the control unit comprises:

a selector configured to receive signals output from the aforementioned at least one or more variable gain amplifiers, and to select one from among the output signals thus received;

a comparator configured to compare the signal thus selected by the selector with a predetermined threshold value, and to generate level data which represents the comparison result;

at least one or more gain setting units, each of which is provided to a corresponding one of the aforementioned at least one or more variable gain amplifiers, and each of which comprises a peak hold circuit configured to hold the value of the level data when the level data generated for the corresponding variable gain amplifier becomes a predetermined level at least once, and configured to set the gain of the corresponding variable gain amplifier according to an output signal of the peak hold circuit, wherein the control unit further comprises a demultiplexer configured to receive the level data output from the comparator, and to output the level data thus received to a gain setting unit, selected from among the aforementioned at least one or more gain setting units.

6. The level adjustment circuit according to claim 5, wherein the comparator generates level data which represents at least three states, comprising a state in which the output signal of the selector is higher than a predetermined upper limit level, a state in which the output signal of the selector is lower than a predetermined lower limit level, and a state in which the output signal of the selector is in a range between the upper limit level and the lower limit level, and wherein the aforementioned at least one or more gain control units each comprise a counter configured to count up or otherwise to count down according to the level data, and are each configured to set the gain of the corresponding variable gain amplifiers according to the count value of the counter.

7. The level adjustment circuit according to claim 5, wherein the selector is configured to select, in sequence and in a time sharing manner, at least one or more output signals set beforehand from among the signals output from the aforementioned at least one or more variable gain amplifiers.

8. An audio system comprising:
a level adjustment circuit configured to adjust the level of an audio signal;
a main amplifier configured to amplify an output signal of the level adjustment circuit; and
an electroacoustic transducer configured to be driven by the main amplifier, wherein the level adjustment circuit comprises:
at least one or more filters, each of which is configured to receive an input audio signal, and to pass a band set for the respective filter;
at least one or more variable gain amplifiers, each of which is provided to a corresponding aforementioned filter, and each of which is configured to amplify an output signal of the corresponding filter;
an adder configured to sum the input audio signal and the output signals of the aforementioned at least one or more variable gain amplifiers; and
a control unit configured to monitor the level of the output signal of each of the aforementioned at least one or more variable gain amplifiers, and to control the gain of each of the aforementioned at least one or more variable gain amplifiers according to the level thus monitored,
wherein the control unit comprises:
a selector configured to receive signals output from the aforementioned at least one or more variable gain amplifiers, and to select one from among the output signals thus received;
a comparator configured to compare the signal thus selected by the selector with a predetermined threshold value, and to generate level data which represents the comparison result;
at least one or more gain setting units, each of which is provided to a corresponding one of the aforementioned at least one or more variable gain amplifiers, and each of which comprises a peak hold circuit configured to hold the value of the level data when the level data generated for the corresponding variable gain amplifier becomes a predetermined level at least once, and configured to set the gain of the corresponding variable gain amplifier according to an output signal of the peak hold circuit, wherein the control unit further comprises a demultiplexer configured to receive the level data output from the comparator, and to output the level data thus received to a gain setting unit, selected from among the aforementioned at least one or more gain setting units.

9. A level adjustment circuit configured to adjust the level of an audio signal, comprising:
at least one or more filters, each of which is configured to receive an input audio signal, and to pass a band set for the respective filter;
at least one or more variable gain amplifiers, each of which is provided to a corresponding aforementioned filter, and each of which is configured to amplify an output signal of the corresponding filter;
an adder configured to sum the input audio signal and the output signals of the aforementioned at least one or more variable gain amplifiers; and
a control unit configured to monitor the level of the output signal of each of the aforementioned at least one or more variable gain amplifiers, and to control the gain of each of the aforementioned at least one or more variable gain amplifiers according to the level thus monitored,
wherein the control unit comprises:
a selector configured to receive the output signals of the aforementioned at least one or more variable gain amplifiers, and to select one from among the output signals thus received;
a peak hold circuit configured to receive the signal thus selected by the selector, and to hold the peak level of the signal thus received;
a comparator configured to compare the output signal of the peak hold circuit with a predetermined threshold value, and to generate level data which represents the comparison result; and
at least one or more gain setting units, each of which is provided to a corresponding one of the aforementioned at least one or more variable gain amplifiers, and each of which is configured to set the gain of the corresponding variable gain amplifier according to the level data generated for the corresponding variable gain amplifier,
wherein the selector is configured to select, in sequence and in a time sharing manner, at least one or more output signals set beforehand from among the signals output from the aforementioned at least one or more variable gain amplifiers,
wherein the periods for which the selector selects the output signals of the variable gain amplifiers differ in increments of the pass bands of the filters that correspond to the variable gain amplifiers.

10. The level adjustment circuit according to claim 9, wherein the comparator generates level data which represents at least three states, comprising a state in which the output signal of the peak hold circuit is higher than a predetermined upper limit level, a state in which the output signal of the peak hold circuit is lower than a predetermined lower limit level, and a state in which the output signal of the peak hold circuit is in a range between the upper limit level and the lower limit level, and wherein the aforementioned at least one or more gain control units each comprise a counter configured to count up or otherwise to count down according to the level data, and are each configured to set the gain of the corresponding variable gain amplifiers according to the count value of the counter.

11. The level adjustment circuit according to claim 9, wherein the control unit further comprises a demultiplexer configured to receive the level data output from the comparator, and to output the level data thus received to a gain setting unit, selected from among the aforementioned at least one or more gain setting units.

12. An audio system comprising:
a level adjustment circuit configured to adjust the level of an audio signal;
a main amplifier configured to amplify an output signal of the level adjustment circuit; and
an electro acoustic transducer configured to be driven by the main amplifier, wherein the level adjustment circuit comprises:
at least one or more filters, each of which is configured to receive an input audio signal, and to pass a band set for the respective filter;
at least one or more variable gain amplifiers, each of which is provided to a corresponding aforementioned filter, and each of which is configured to amplify an output signal of the corresponding filter;
an adder configured to sum the input audio signal and the output signals of the aforementioned at least one or more variable gain amplifiers; and
a control unit configured to monitor the level of the output signal of each of the aforementioned at least one or more variable gain amplifiers, and to control the gain of each of the aforementioned at least one or more variable gain amplifiers according to the level thus monitored,
wherein the control unit comprises:
a selector configured to receive the output signals of the aforementioned at least one or more variable gain amplifiers, and to select one from among the output signals thus received;
a peak hold circuit configured to receive the signal thus selected by the selector, and to hold the peak level of the signal thus received;
a comparator configured to compare the output signal of the peak hold circuit with a predetermined threshold value, and to generate level data which represents the comparison result; and
at least one or more gain setting units, each of which is provided to a corresponding one of the aforementioned at least one or more variable gain amplifiers, and each of which is configured to set the gain of the corresponding variable gain amplifier according to the level data generated for the corresponding variable gain amplifier,
wherein the selector is configured to select, in sequence and in a time sharing manner, at least one or more output signals set beforehand from among the signals output from the aforementioned at least one or more variable gain amplifiers,
wherein the periods for which the selector selects the output signals of the variable gain amplifiers differ in increments of the pass bands of the filters that correspond to the variable gain amplifiers.

13. A level adjustment circuit configured to adjust the level of an audio signal, comprising:
at least one or more filters, each of which is configured to receive an input audio signal, and to pass a band set for the respective filter;
at least one or more variable gain amplifiers, each of which is provided to a corresponding aforementioned filter, and each of which is configured to amplify an output signal of the corresponding filter;
an adder configured to sum the input audio signal and the output signals of the aforementioned at least one or more variable gain amplifiers; and
a control unit configured to monitor the level of the output signal of each of the aforementioned at least one or more variable gain amplifiers, and to control the gain of each of the aforementioned at least one or more variable gain amplifiers according to the level thus monitored,
wherein the control unit comprises:
a selector configured to receive the output signals of the aforementioned at least one or more variable gain amplifiers, and to select one from among the output signals thus received;
a peak hold circuit configured to receive the signal thus selected by the selector, and to hold the peak level of the signal thus received;
a comparator configured to compare the output signal of the peak hold circuit with a predetermined threshold value, and to generate level data which represents the comparison result; and
at least one or more gain setting units, each of which is provided to a corresponding one of the aforementioned at least one or more variable gain amplifiers, and each of which is configured to set the gain of the corresponding variable gain amplifier according to the level data generated for the corresponding variable gain amplifier,
wherein the control unit further comprises a demultiplexer configured to receive the level data output from the comparator, and to output the level data thus received to a gain setting unit, selected from among the aforementioned at least one or more gain setting units.

14. The level adjustment circuit according to claim 13, wherein the comparator generates level data which represents at least three states, comprising a state in which the output signal of the peak hold circuit is higher than a predetermined upper limit level, a state in which the output signal of the peak hold circuit is lower than a predetermined lower limit level, and a state in which the output signal of the peak hold circuit is in a range between the upper limit level and the lower limit level,
and wherein the aforementioned at least one or more gain control units each comprise a counter configured to count up or otherwise to count down according to the level data, and are each configured to set the gain of the corresponding variable gain amplifiers according to the count value of the counter.

15. The level adjustment circuit according to claim 13, wherein the selector is configured to select, in sequence and in a time sharing manner, at least one or more output signals set beforehand from among the signals output from the aforementioned at least one or more variable gain amplifiers.

16. An audio system comprising:
a level adjustment circuit configured to adjust the level of an audio signal;
a main amplifier configured to amplify an output signal of the level adjustment circuit; and
an electro acoustic transducer configured to be driven by the main amplifier, wherein the level adjustment circuit comprises:
at least one or more filters, each of which is configured to receive an input audio signal, and to pass a band set for the respective filter;
at least one or more variable gain amplifiers, each of which is provided to a corresponding aforementioned filter, and each of which is configured to amplify an output signal of the corresponding filter;

an adder configured to sum the input audio signal and the output signals of the aforementioned at least one or more variable gain amplifiers; and a control unit configured to monitor the level of the output signal of each of the aforementioned at least one or more variable gain amplifiers, and to control the gain of each of the aforementioned at least one or more variable gain amplifiers according to the level thus monitored, wherein the control unit comprises:

a selector configured to receive the output signals of the aforementioned at least one or more variable gain amplifiers, and to select one from among the output signals thus received;

a peak hold circuit configured to receive the signal thus selected by the selector, and to hold the peak level of the signal thus received;

a comparator configured to compare the output signal of the peak hold circuit with a predetermined threshold value, and to generate level data which represents the comparison result; and at least one or more gain setting units, each of which is provided to a corresponding one of the aforementioned at least one or more variable gain amplifiers, and each of which is configured to set the gain of the corresponding variable gain amplifier according to the level data generated for the corresponding variable gain amplifier, wherein the control unit further comprises a demultiplexer configured to receive the level data output from the comparator, and to output the level data thus received to a gain setting unit, selected from among the aforementioned at least one or more gain setting units.

* * * * *